(12) United States Patent
Downes

(10) Patent No.: US 6,429,645 B1
(45) Date of Patent: Aug. 6, 2002

(54) VERIFICATION GAUGE FOR AN ELECTRONIC PACKAGE LEAD INSPECTION APPARATUS

(75) Inventor: Stuart D. Downes, Milford, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/608,287

(22) Filed: Jun. 30, 2000

Related U.S. Application Data

(63) Continuation of application No. 08/995,675, filed on Dec. 22, 1997, now Pat. No. 6,084,397.

(51) Int. Cl.⁷ .............................................. G01R 31/02
(52) U.S. Cl. ..................... 324/158.1; 324/765
(58) Field of Search ......................... 324/158.1, 755, 324/757, 758, 761, 765

(56) References Cited

U.S. PATENT DOCUMENTS

| | | | |
|---|---|---|---|
| 3,711,929 A | 1/1973 | Blakely | 29/407 |
| 4,134,209 A | 1/1979 | Fariss, Jr. | 33/1 N |
| 4,736,108 A | 4/1988 | Comstock et al. | 250/561 |
| 4,737,845 A | 4/1988 | Susuki et al. | 358/101 |
| 4,759,073 A | 7/1988 | Shah et al. | 382/8 |
| 5,402,505 A | 3/1995 | Roy et al. | 382/8 |
| 5,450,206 A | 9/1995 | Caillat et al. | 356/394 |
| 5,465,152 A | 11/1995 | Bilodeau et al. | 356/371 |
| 5,477,138 A * | 12/1995 | Erjavic et al. | 324/158.1 |
| 5,489,843 A | 2/1996 | Erjavic et al. | 324/158.1 |
| 5,574,668 A | 11/1996 | Beaty | 364/558 |
| 5,600,150 A | 2/1997 | Stern et al. | 250/559.29 |
| 5,621,530 A * | 4/1997 | Marrable, Jr. | 356/294 |
| 5,654,800 A | 8/1997 | Svetkoff et al. | 356/376 |
| 5,838,434 A | 11/1998 | Skramsted et al. | 356/243 |

OTHER PUBLICATIONS

Dana Design Brochure, "Golden Units for Accuracy and Performance Verification" 1991.*

* cited by examiner

Primary Examiner—N. Le
Assistant Examiner—T. R. Sundaram
(74) Attorney, Agent, or Firm—Wolf, Greenfield & Sacks, P.C.

(57) ABSTRACT

A verification gauge for verifying the operation of an inspection system for inspecting the leads of an electronic package, particularly a ball grid array. The gauge has a predetermined mechanical relationship to a mechanical parameter of the leads of the electronic package so that when the inspection system is used to inspect the gauge, a reading will indicate whether the inspection system is properly set up for the mechanical parameter. The gauge may be configured to substantially emulate the structural configuration, including the particular size, shape and lead pattern, of the electronic package. The gauge may be used to verify the calibration or the predefined limit of the inspection system for the mechanical parameter, including lead coplanarity, lead pitch, missing lead and lead deformation parameters.

17 Claims, 5 Drawing Sheets

VERIFICATION GAUGE FOR AN ELECTRONIC PACKAGE LEAD INSPECTION APPARATUS

This application is a continuation of U.S. application Ser. No. 08/995,675, filed on Dec. 22, 1997, now U.S. Pat. No. 6,084,397.

BACKGROUND OF THE INVENTION

1. Field of the Invention

The present invention relates to a gauge for verifying the operation of an apparatus for inspecting leads of an electronic package, and more particularly to a gauge for verifying the calibration and inspection parameters of a lead inspection apparatus for ball grid arrays.

2. Description of Related Art

The electronics industry is continually decreasing the size of electronic devices while increasing the pin count of the devices in an effort to increase the density of electronic packaging. Surface mount technology provides the industry with the ability to continue this trend since surface mount leads can be located relatively close to each other, as compared to through-hole technology. Common surface mount devices include ball grid arrays (BGAs), quad flat packs (QFPs), flat packs, gull-wing devices and the like.

As the pin count increases and lead spacing decreases, controlling mechanical parameters of the component leads, such as lead coplanarity, lead pitch, missing leads, lead deformation and the like, is critical for ensuring proper electrical interconnections when the components are installed on a printed circuit board. Consequently, lead inspection systems are utilized throughout the industry, from component manufacturing to printed circuit board assembly, for inspecting the leads of electronic packages to ensure that they meet their dimensional requirements.

Conventional lead inspection systems include infrared systems, laser scanning systems, gray scale camera systems and the like. Lead inspection systems typically analyze one or more mechanical features of an electronic package using various algorithms that compare the results of detector readings to predetermined parameter limits to determine whether the component is an acceptable or an unacceptable device. The accuracy of inspection systems, however, may be affected by several factors, including system calibration and programmed inspection parameters, that can lead to improper component acceptances and/or rejections with the potential result that a defective component is installed on a board or a perfectly good component is discarded as defective.

Since system calibration may change or drift over a period of time, it is necessary that system calibration be periodically tested and adjusted to alleviate any potential problems due to an improperly calibrated system. Calibration methods used in the industry, which typically utilize optics, 3-D triangulation sensors and lasers, require a considerable amount of time to calibrate a system. Consequently, an inspection system may not be calibrated often enough to ensure accurate electronic component inspections. Additionally, these calibration methods typically cannot be performed on-line and require a production line shutdown.

Even when an inspection system is properly calibrated, electronic components may still be improperly rejected or accepted due to an inspection process error. For example, an operator typically programs an inspection system with one or more predetermined inspection parameters to define the allowable limits against which a particular electronic package is compared when evaluating whether to accept or reject the component. When a parameter limit is incorrectly programmed into the system, a component can be improperly accepted or rejected even though the system calibration is accurate. Such process errors generally will not be discovered by testing the calibration of the system.

A "golden" component, which is an actual electronic component with known dimensions, may be used to verify the calibration and inspection parameters of an inspection system. However, the dimensions of the golden component leads can become altered due to handling and its repeated use as a verification unit. Verification units have been developed that are more robust than a golden component so that the unit may be more likely to maintain its mechanical parameters even with repeated use and handling.

U.S. Pat. Nos. 5,489,832 and 5,477,138 to Erjavic et al. disclose verification units which resemble certain aspects of quad flat pack and plastic leaded chip carrier type packages and are used for testing the calibration of a lead inspection system for such electronic packages. These units, however, are not suitable for verifying the calibration or process parameters of a lead inspection system for a ball grid array (BGA), including plastic and ceramic BGAs, micro BGAs and similar chip on board components.

In view of the foregoing, it is an object of the present invention to provide an improved device and a method for verifying the calibration and process parameters of a lead inspection apparatus for inspecting predetermined mechanical parameters of a ball grid array and similar chip on board components, and a method of manufacturing the device.

SUMMARY

In one embodiment of the invention, a verification gauge is provided for verifying the operation of a lead inspection apparatus for inspecting leads of an electronic package that is comprised of a package body and a plurality of conductive leads arranged on the package body in a lead pattern. The electronic package has a predefined limit for at least one mechanical parameter of its conductive leads. The gauge has a predetermined mechanical relationship to the mechanical parameter of the conductive leads so that when the inspection system is used to inspect the gauge, the inspection system will provide a reading that is indicative as to whether the inspection system is properly set up for the at least one mechanical parameter.

In one illustrative embodiment of the invention, the verification gauge includes a gauge body having a plurality of apertures disposed on an outer surface thereof and a plurality of gauge lead members disposed in the plurality of apertures. The apertures are arranged to correspond to at least a portion of the lead pattern of the electronic package and at least a portion of each gauge lead member protrudes from a corresponding aperture by a predetermined amount beyond the outer surface of the gauge body. At least one of the gauge lead members has a predetermined mechanical relationship to at least one mechanical parameter of an electronic package.

In another illustrative embodiment of the invention, the verification gauge comprises a gauge body that is devoid of electronic circuitry, and a plurality of gauge balls arranged on the gauge body to correspond to at least a portion of the lead pattern, at least one of the gauge balls having a predetermined mechanical relationship to at least one mechanical parameter of a ball grid array.

In a further illustrative embodiment of the invention, a method of manufacturing the verification gauge comprises steps of providing a gauge base plate having a plurality of gauge holes extending therethrough that are arranged to correspond to at least a portion of the lead pattern of a ball grid array; providing a plurality of gauge balls; and placing the plurality of gauge balls in the plurality of gauge holes with at least a portion of each ball protruding from an outer surface of the gauge base plate. At least one of the gauge balls has a predetermined mechanical relationship to at least one mechanical parameter of the ball grid array.

In another illustrative embodiment of the invention, a method for verifying the operation of an inspection system for a ball grid array comprises steps of providing at least one verification gauge; inspecting the gauge with the inspection system for the at least one mechanical parameter; and determining whether the inspection system is properly set up for detecting when the predefined limit for at least one mechanical parameter is exceeded by a ball grid array. The verification gauge is comprised of a gauge body that is devoid of electronic circuitry, and a plurality of gauge balls arranged on the gauge body to correspond to at least a portion of the lead pattern, at least one of the gauge balls having a predetermined mechanical relationship to the at least one mechanical parameter of the ball grid array.

The gauge may be configured to substantially emulate the structural configuration, including the particular size, shape and lead pattern, of the electronic package. The gauge may be used to verify the calibration or the predefined limit of the inspection system for the mechanical parameter, including lead coplanarity, lead pitch, missing lead and lead deformation parameters. The gauge may be configured to be either "acceptable", such that the gauge is within the predefined limit for the mechanical parameter, or "nonacceptable", such that the gauge exceeds the predefined limit for the mechanical parameter.

BRIEF DESCRIPTION OF THE DRAWINGS

The foregoing and other objects and advantages of the present invention will become apparent with reference to the following detailed description when taken in conjunction with the accompanying wings in which.

DETAILED DESCRIPTION

Figure 1:
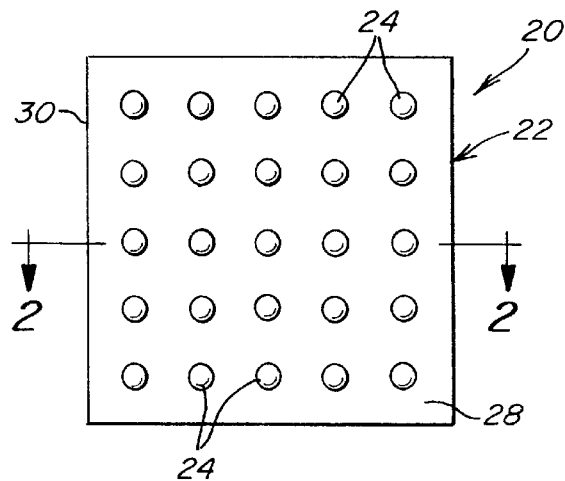
FIG. 1 is a bottom view of an illustrative embodiment of a verification gauge according to the present invention.
Figure 2:
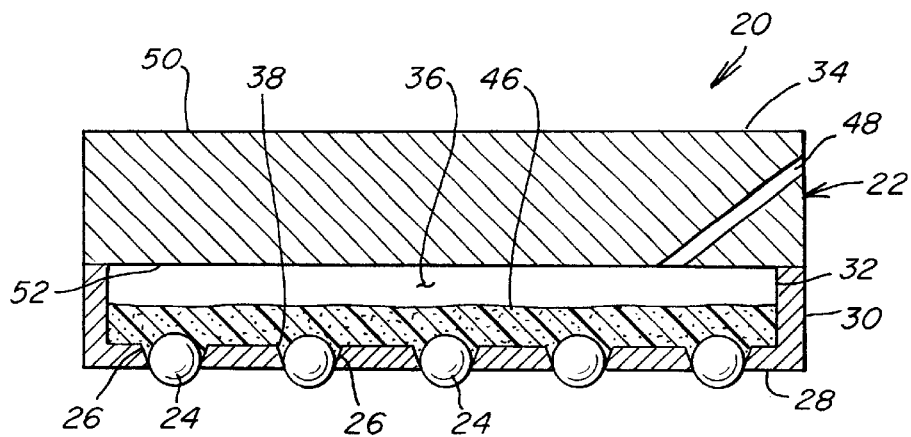
FIG. 2 cross-sectional view of the gauge taken along section line 2—2 of FIG. 1.
Figure 3:
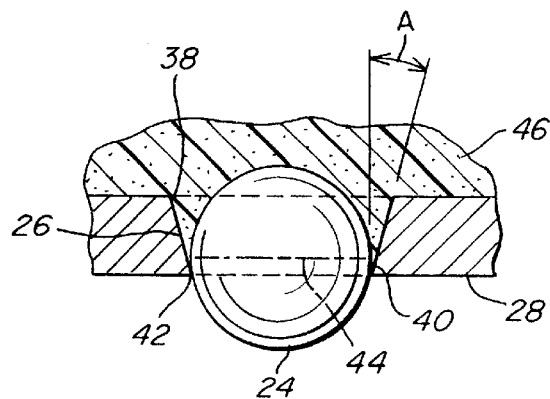
FIG 3 is an enlarged view of the gauge of FIG. 2 illustrating an arrangement for controlling the amount of ball protrusion from the gauge.

In one illustrative embodiment of the invention shown in FIGS. 1–3, a verification gauge is provided for verifying the operation of an inspection apparatus for inspecting one or more mechanical parameters of the leads of an electronic package. The verification gauge 20 includes a gauge body 22 and a plurality gauge lead members 24 that are precisely located on the gauge body to establish a predetermined mechanical relationship with the mechanical parameters of the electronic package leads. As discussed more fully below, the gauge 20 can be used to check the calibration of the inspection system or to verify the preprogrammed inspection limits for mechanical parameters that may include lead coplanarity, lead pitch, missing leads and lead deformation. When the inspection system is used to inspect the gauge 20, the inspection system will provide a reading that is indicative as to whether the inspection system is properly set up for one or more of the mechanical parameters. The gauge body 22 is devoid of electronic circuitry so that the gauge 20 is an electronically nonfunctional device.

In one embodiment of the invention, the gauge body 22 has a plurality of apertures 26 disposed on its outer surface 28, and the plurality of gauge lead members 24 are disposed in the apertures 26 to protrude from the outer surface 28 of the body. The gauge body 22 may include a base plate 30 with a recess 32 and a cover plate 34 that is attached to the base plate 30 over the recess 32 to form an internal cavity 36. The apertures 26 extend through the base plate 30 from the cavity 36 to the outer surface 28 of the body. The lead members 24 are seated in the outer end of the apertures 26 opposite the cavity 36 so that at least a portion of each lead member 24 extends beyond the outer surface 28 of the body.

As illustrated in FIGS. 2–3, each aperture 26 is a hole and each gauge lead member 24 is a ball that cooperates with the hole 26 in a manner that controls the amount of ball protrusion from the body. Each hole 26 may be tapered so that its diameter decreases in a direction from the cavity 36 toward the outer surface 28 of the base plate. In particular, the diameter decreases from a first diameter at a first end 38 of the hole 26 to a second diameter at a second end 40 of the hole 26 to form a lip 42 or knife edge adjacent the outer surface 28 of the plate. The first diameter of the hole is greater than the ball diameter while the second diameter of the hole is less than the ball diameter so that the ball 24 can be readily inserted into the first end 38 of the hole and retained in the base plate 30 by the lip 42 at the second end 40 of the hole.

The relative sizes between the hole 26 and the ball 24 controls the amount of ball protrusion from the gauge body 22. As the diameter of the lip 42 decreases relative to the ball diameter, the amount of ball protrusion from the base plate 30 will also decrease. Consequently, the amount of protrusion of a ball 24 relative to the gauge body 22 and the other balls 24 may be readily established using precisely formed holes and balls of predetermined dimensions.

In one embodiment of the invention, each of the balls 24 has substantially the same diameter and the amount of ball protrusion is controlled by forming precisely dimensioned tapered holes 26. The holes 26 may be formed using chemical photoetching and electropolishing processes. Other processes such as laser drilling may also be utilized to form the holes. The balls 24 may be commercially available precision ground ball bearings. Preferably, the relative sizes of the holes and balls are determined so that the balls are contacted by the lip 42 of the hole approximately 1 to 1.5 mils below the centerline 44 of the ball to ensure that the ball is retained by the hole.

The gauge balls 24 may be fixed in the holes 26 to maintain their predetermined mechanical relationship to the mechanical parameters of the electronic package. In one embodiment, the cavity 36 is partially filled with a potting compound 46 that fills each hole above the ball. The volume of potting compound 46 is preferably less than the volume of the cavity 36 so that, when the cover plate 34 is placed on the base plate 30, the compound is not squeezed from the cavity and onto the interface surfaces between the cover plate and the base plate. A vent 48 may be provided through the cover plate 34 so that air may be vented from the cavity when the cover plate is attached to the base plate.

Figure 4A:
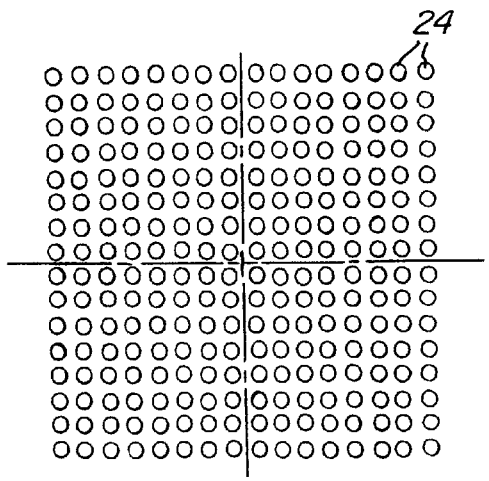
FIGS. 4A–4D are schematic lead patterns for typical ball grid arrays.
Figure 4B:
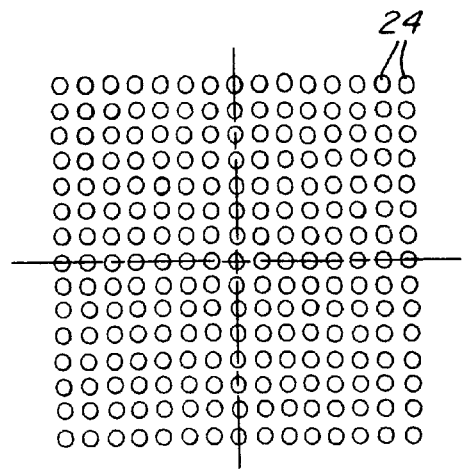
Figure 4C:
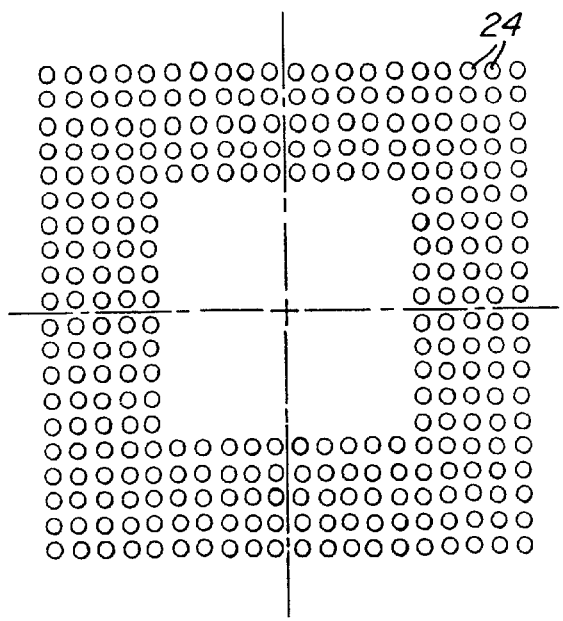
Figure 4D:
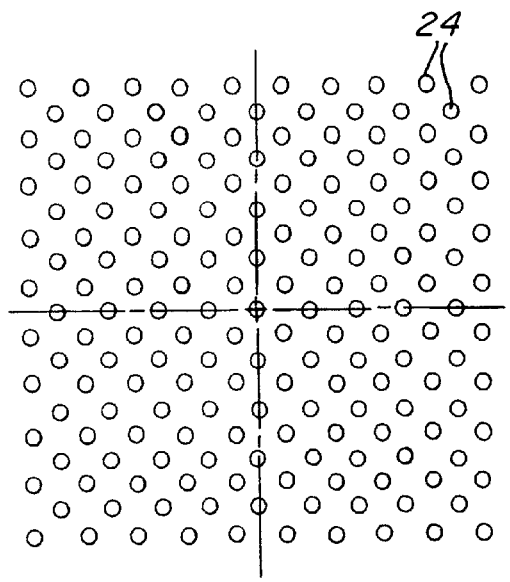

As illustrated, the gauge includes twenty-five balls 24 arranged in a 5×5 grid pattern of columns and rows. It is contemplated that the actual gauge ball configuration matches the particular number and pattern of solder balls for a BGA being inspected by a lead inspection system. It should be understood, however, that the gauge may be configured to match a subset of the BGA ball pattern. Examples of various BGA ball patterns, as shown in FIGS. 4A–4D, may include an even row/column pattern (FIG. 4A), an odd row/column pattern (FIG. 4B), a zone depopulation pattern (FIG. 4C), and a staggered pattern (FIG. 4D). It should be appreciated that a gauge can be provided to match numerous other possible lead patterns.

In one embodiment of the invention, the base plate 30, cover plate 34 and gauge balls 24 are made from a material, such as stainless steel, that ensures a structurally rugged gauge that can withstand rough handling and repeated use without adversely affecting its accuracy. The cover plate 34 may be precisely aligned with the base plate 30 using tooling pins (not shown) and attached to the base plate using an adhesive (for example, a cyanoacrylate), fasteners or the like. The potting compound 46 for fixing the balls 24 in the gauge may be a polyurethane elastomer that can be cured at room or relatively low temperature. The balls 24 and the lower surface 28 of the base plate 30 may be passivated or electroplated to produce a contrasting refraction index for use with inspection systems that utilize automated vision alignment.

In one embodiment, the base plate 30 has an overall thickness of approximately 0.030 inches and a recess depth of approximately 0.020 inches, the cover plate 34 has a thickness of approximately 0.125 inches, and the vent hole 48 has a diameter of approximately 0.015–0.020 inches. The upper and lower surfaces 50, 52 of the cover plate 34 may be precision ground or lapped to be parallel to each other to within 0.0005 inches, or better, so that the cover plate has minimal affect on the mechanical parameters of the gauge balls, particularly when the upper surface 50 of the gauge is used by a pick up tool of the inspection system as the datum location surface. The peripheral configuration and dimensions of the gauge 20 may correspond to the particular package configuration of the BGA being inspected by the inspection system.

The gauge 20 may be used as a baseline device when testing and adjusting, as necessary, the calibration of the inspection apparatus or verifying the preprogrammed inspection limits for one or more mechanical parameters including coplanarity, lead pitch, missing lead, lead deformation and the like. In one embodiment, the gauge 20 may be configured to be "acceptable" so that each mechanical parameter is within its allowable limit to ensure that the inspection apparatus properly accepts a satisfactory electronic package. Conversely, the gauge 20 may be configured to be "nonacceptable" with one or more mechanical parameters outside its allowable limit to ensure that the inspection apparatus properly rejects an unacceptable electronic package. Additionally, a set of gauges 20 may be provided that includes a gauge that is configured as an ideal component to be used to calibrate an inspection apparatus, and various "acceptable" and "nonacceptable" gauges configured to verify the calibration and inspection limits for one or more mechanical parameters of interest. Preferably, a separate gauge is provided for checking each mechanical parameter. It is to be appreciated, however, that a gauge may be configured for checking multiple parameters of the system.

The following embodiments of the invention are presented to illustrate a gauge that is suitable for verifying a particular mechanical parameter of a ball grid array (BGA), including plastic and ceramic BGAs, micro BGAs and similar chip on board components. It is to be understood, however, that the embodiments are included for illustrative purposes only and are not intended to limit the scope of the invention.

One mechanical parameter of interest for ball grid arrays is lead coplanarity which is the distance between a seating plane and a lead of the device. An electronic package with leads that exceed a predetermined amount of coplanarity can result in weak or defective solder joints. Noncoplanarity in a BGA is primarily due to nonuniformly shaped solder balls, warpage or cupping of the component package, or a combination these factors. When a BGA is placed ball side down on a flat surface, the tips of three balls surrounding the package center of gravity will rest on the flat surface and define the seating plane of the package. The tip of each remaining ball typically will lie above the seating plane by an amount corresponding to its coplanarity value. As long as the coplanarity value for each ball does not exceed a predetermined limit, the component is acceptable.

Figure 5:
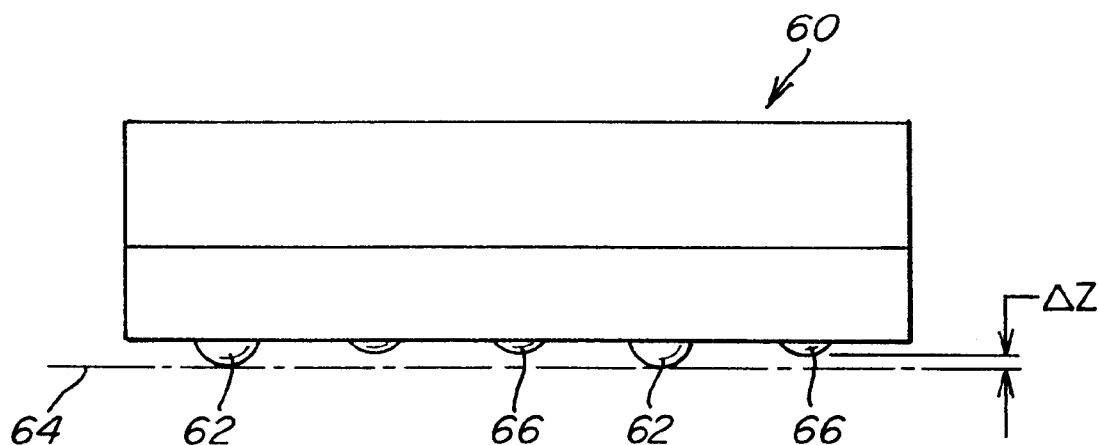
FIG. 5 is a side view of an illustrative embodiment of a verification gauge configured for assessing coplanarity parameters.
Figure 6:
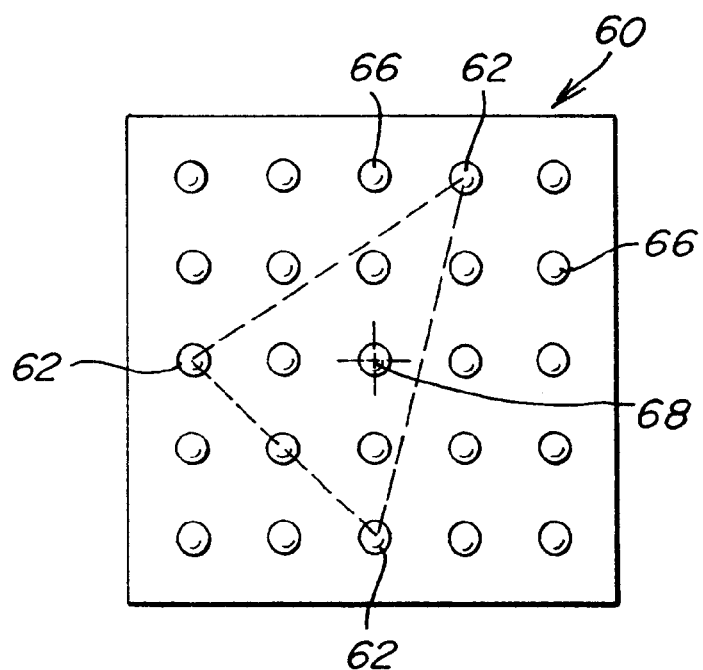
FIG. 6 is a bottom view of the gauge of FIG. 5.

FIGS. 5–6 illustrate a gauge configuration that is suitable for assessing the coplanarity calibration or the programmed coplanarity limit of an inspection apparatus. The gauge 60 includes at least three balls 62 that protrude from their respective holes by a predetermined amount to define a seating plane 64 for the gauge, and at least one ball 66 that protrudes from its respective hole so that its tip lies above the seating plane 64 by a predetermined amount corresponding to a desired coplanarity value $\Delta Z$. The balls 62 defining the seating plane 64 are located on the gauge body so that they surround the center of gravity 68 of the gauge. The ball 66 located above the seating plane 64 may be located to have a coplanarity value $\Delta Z$ that either exceeds or does not exceed the coplanarity limit to respectively form a "nonacceptable" gauge or an "acceptable" gauge to verify the inspection system on each side of the coplanarity limit. As discussed above, the amount of ball protrusion can be readily established, for example, by controlling the sizes of the balls and their corresponding holes. For example, an "acceptable" gauge and a "nonacceptable" gauge may be provided to verify that the inspection apparatus is properly rejecting electronic packages having a coplanarity limit of 0.008 inches, which is a typical limit allowed for a plastic BGA package. The "acceptable" gauge may be configured so that one or more balls lie approximately 0.007 inches (7 mils) above the seating plane, and the "nonacceptable" gauge may be configured so that one or more balls lie approximately 0.009 inches (9 mils) above the seating plane.

In one embodiment, the seating plane may be defined by at least three balls 62 having a diameter of 30.0±0.1 mils that are disposed about the center of gravity 68 of the gauge in a tapered hole having a lip diameter of 29.6±0.2 mils. The "acceptable" gauge may include one or more balls 66 with a diameter of 30.0±0.1 mils that are disposed in a tapered hole having a lip diameter of 25.4±0.2 mils to establish a gauge coplanarity value ΔZ no greater than 7 mils. The "nonacceptable" gauge may include one or more balls 66 with a diameter of 30.0±0.1 mils that are disposed in a tapered hole having a lip diameter of 17.0±0.2 mils to establish a gauge coplanarity value ΔZ of at least 9 mils. The remaining balls and holes may be configured so that the balls lie anywhere between the seating plane and the established coplanarity value. The tapered holes for each of the gauge balls can have a tapered angle A (FIG. 3) of approximately 8° to 15° depending on the particular ball pitch of the gauge. It is to be understood that these dimensions are exemplary and that other ball and hole sizes may be utilized to create a gauge that has any desired coplanarity value.

Figure 7:
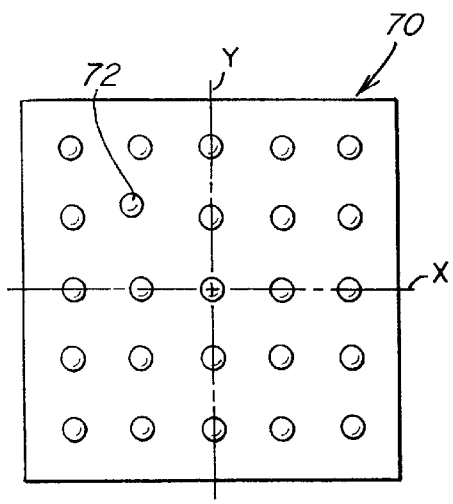
FIG. 7 is a bottom view of an illustrative embodiment of a verification gauge configured for assessing lead pitch error parameters.
Figure 8:
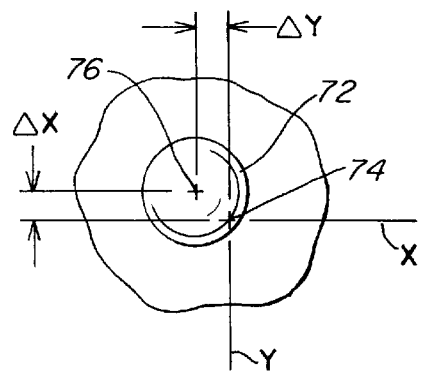
FIG. 8 is an enlarged schematic view of the gauge of FIG. 7 illustrating a gauge ball that is located off grid.

Another mechanical parameter of interest for ball grid arrays is lead pitch error. Solder balls for a BGA are generally positioned relative to a two-dimensional X-Y grid to ensure that the balls will properly align with corresponding pads on a printed circuit board and the like to establish a desired electrical connection between the BGA and the board. While ideally located at its basic X-Y grid coordinate, each solder ball will generally deviate by some amount from its basic grid position due to manufacturing process tolerances. Consequently, it is desirable to maintain this deviation or lead pitch within a defined lead pitch tolerance to ensure proper alignment between the solder balls and the board during the assembly process. FIGS. 7–8 illustrate a gauge configuration that is suitable for assessing the lead pitch calibration or programmed pitch value of an inspection apparatus. The gauge 70 includes at least one ball 72 that is positioned relative to the X-Y grid so that it deviates from its basic grid location 74 by predetermined amounts ΔX, ΔY corresponding to a desired lead pitch limit. The amount of lead pitch for each ball can be readily established by controlling the position of its corresponding hole since the center axes of the ball and hole substantially coincide due to their respective shapes. Each hole may be precisely located relative to the X-Y grid using a photoetching or similar precision process.

For example, to verify that the inspection apparatus is properly rejecting electronic packages having a lead pitch error that exceeds a limit of 4 mils, a "nonacceptable" gauge may be configured so that one or more balls lies approximately 5 mils off the basic X-Y grid relative to the X-axis, the Y-axis or both axes. This can be readily achieved by forming one or more holes in the base plate so that they are precisely located off grid 76 by desired amounts ΔX, ΔY. It is to be understood that these dimensions are exemplary and that other ball positions may be utilized to create a gauge that has any desired lead pitch value.

A further mechanical parameter of interest for ball grid arrays is missing lead detection. Solder balls for a BGA are generally individually attached to contacts or pads on the bottom of the BGA body using a solder reflow process. Due to a defective solder joint, rough handling and the like, a solder ball may become detached from the BGA package at some point prior to being assembled to a circuit board.

In general, a BGA missing a solder ball would be considered unacceptable and should be detected by an inspection process. However, in some instances a BGA with one or more missing solder balls may test as electrically functional on a circuit board. For example, a BGA that is missing a solder ball for a signal circuit connection would likely be a fatal defect detected during functional board test. Conversely, a BGA missing a solder ball for a ground plane connection may not be detected as the device may include a plurality of solder balls for ground plane connections.

While one or more missing parallel ground balls may not affect the electrical functionality of the device, the thermal conductivity through the missing ball is lost. Conventionally, the semiconductor die of the BGA transfers a portion of its dissipated heat through the ground balls to the circuit planes of the board. Therefore, one or more missing balls may raise the operating temperature of the die and potentially affect long-term reliability of the device. Consequently, it may be desirable to test a lead inspection system to ensure that it is properly screening electronic packages for missing leads prior to mounting it on a board.

Figure 9:
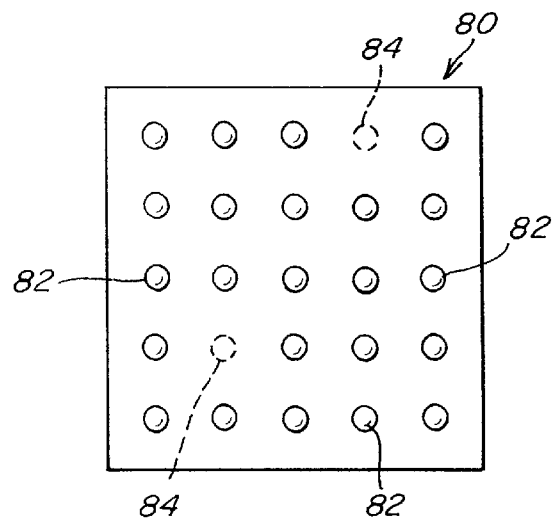
FIG. 9 is a bottom view of an illustrative embodiment of a verification gauge configured for assessing missing lead detection parameters.

FIG. 9 illustrates a gauge configuration that is suitable for assessing the missing ball detection or the missing ball sensitivity of an inspection apparatus for a ball grid array. In one embodiment, the gauge 80 includes a plurality of gauge balls 82 that, although arranged to correspond to the lead configuration of the electronic package, include less than the required number of solder balls. The gauge may include one or more missing ball regions 84, which do not contain a gauge ball 82, corresponding to a solder ball location. The missing ball regions 84 may be located to coincide with functionally necessary solder balls (signal balls), functionally redundant solder balls (ground plane balls) or a combination of both to test the sensitivity of the inspection system. Preferably, although not necessarily, the missing ball regions 84 of the gauge also may not contain a corresponding hole. This is readily accomplished using a photoetching process by simply deleting the missing ball region holes from the photo imaging artwork for the gauge.

Still another mechanical parameter of interest for ball grid arrays is ball diameter which can be indicative of lead deformation or incorrect solder ball size that may result in a weak or defective solder joint between the solder ball and its corresponding board connection. Generally, the solder balls on a BGA package should be substantially spherical members having substantially the same diameters. During the manufacturing process of the BGA, the size and shape of each solder ball may inadvertently become deformed or a solder ball of incorrect size may be inadvertently attached to the BGA package. Consequently, it may be desirable to test a lead inspection system to ensure that it is properly screening BGA packages for deformed or incorrectly sized solder ball leads prior to mounting them on a board.

In one embodiment, a verification gauge suitable for assessing the ball diameter calibration or programmed diameter limit of an inspection apparatus may be similar to the coplanarity gauge 60 described above in connection with FIGS. 5–6. In particular, the diameter of the tapered holes 26 may be controlled to vary the effective diameter of the balls 24 protruding from their corresponding holes. For example, an "nonacceptable" gauge may include one or more holes that are sized so that the effective diameter of the portion of the balls protruding from the holes are undersized, oversized or a combination of both. An "acceptable" gauge may include holes that are each sized so that the effective diameter of the portion of each ball protruding from the holes falls within acceptable limits. It is to be understood that other gauge configurations may be implemented for testing ball diameter calibration including gauges using different diameter balls.

Figure 10:
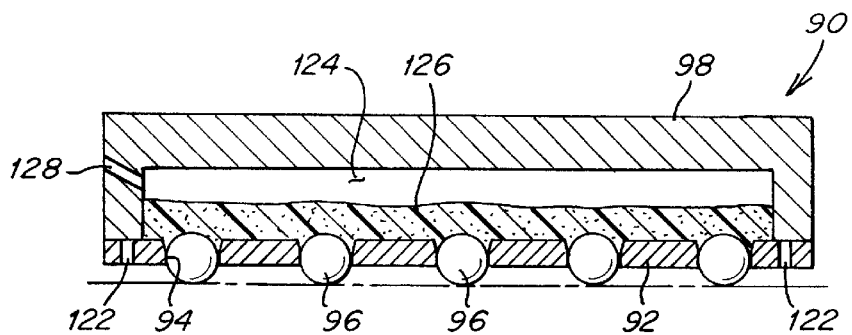
FIG. 10 a cross-sectional side view of another illustrative embodiment of a verification gauge,according to the present invention.
Figure 11:
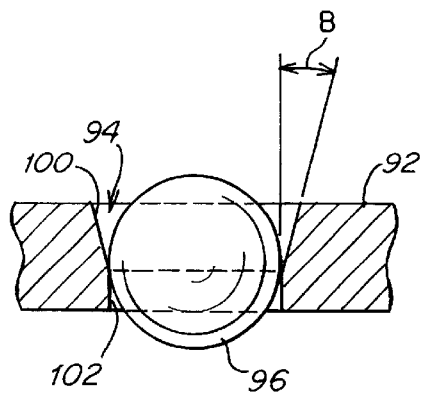
FIG. 11 is an enlarged schematic view of the gauge of FIG. 10 illustrating a gauge ball prior to being coined in a gauge base plate.
Figure 12:
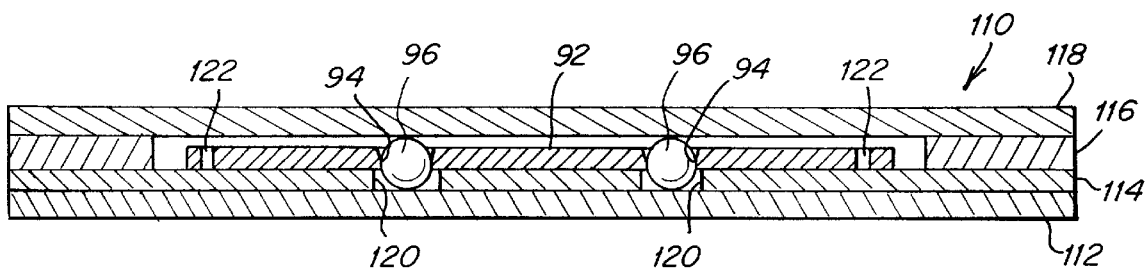
FIG. 12 is an illustrative embodiment of a coining die set that may be used to manufacture verification gauge of FIG. 10.

In another illustrative embodiment of the invention shown in FIGS. 10–12, a verification gauge is manufactured using a coining process that forces gauge balls a predetermined amount through a gauge base plate. A coining process is particularly suited for making a gauge with minimal coplanarity variations between its balls since a coining die set can be made with highly accurate dimensions resulting in ball height variations less than approximately 0.1 mils. Such a gauge would be useful for adjusting the coplanarity calibration since each ball essentially lies in the seating plane with zero ball coplanarity.

The verification gauge 90 includes a gauge base plate 92 having a plurality of gauge holes 94 extending therethrough, a plurality of gauge balls 96 disposed in the holes 94 and a cover plate 98 that is attached to the base plate 92. The gauge holes 94 and balls 96 preferably are arranged to correspond to a particular BGA solder ball pattern. In contrast to the gauge described above, each hole 94 in this embodiment is configured as a countersunk hole (FIG. 11) that includes a tapered upper hole portion 100 and a precision lower hole portion 102. The tapered portion 100 has a diameter and an angle B that is sufficient to collect and locate a ball 96, and the precision hole portion 102 has a diameter that creates an interference fit sufficient to retain the ball 96 in the base plate 92 when the ball is pressed through the hole.

As illustrated in FIG. 12, a coining die set 110 may include a die set base plate 112, a ball depth plate 114, a cavity plate 116 and a top plate 118 configured to be stacked and pressed toward each other to force the gauge balls 96 into the gauge base plate 92. The ball depth plate 114 has a plurality of guide holes 120 that are arranged to correspond to the gauge holes 94. Each of the guide holes 120 has a diameter that is greater than the corresponding ball diameter so that the depth plate 114 does not impede with coining the ball 96 in the base plate while maintaining a precise ball pitch between adjacent gauge balls. The thickness of the cavity plate 116 and the ball depth plate 114 may be ground flat and lapped to be within millionths of a desired dimension to precisely control the amount of gauge ball protrusion from the gauge base plate 92 by controlling the spacing between the top plate 118 and the cavity plate 116 and the spacing between the ball depth plate 114 and the die set base plate 112.

To assemble a verification gauge using the coining die set, the gauge base plate 92 is positioned within the cavity plate 116 and on the ball depth plate 114 so that the gauge holes 94 are aligned with the guide holes 120. Precise hole alignment may be achieved using tooling holes 122 on the gauge base plate 92 that mate with corresponding tooling pins (not shown) provided on the ball depth plate 114. The tooling holes 122 and pins may be configured to ensure that the gauge base plate 92 remains flat during the coining process. Gauge balls 96 are placed in each of the tapered hole portions 100 and pressed through the precision hole portions 102 using the top plate 118 until the top plate abuts the cavity plate. As the balls 96 are pressed through the gauge holes 94, the material surrounding the precision holes 102 is forced to stretch and cold form around each ball.

Once the balls 96 are coined to the gauge base plate 92, the cover plate 98 is attached to the base plate 92. The balls may be secured in their desired position to maintain the amount of ball protrusion by partially filling a cavity 124 between the cover plate 98 and base plate 92 with a potting compound 126, such as a polyurethane elastomer. The cover plate 98 may be attached to the base plate 92 using an adhesive material (for example, a cyanoacrylate), fasteners or the like. An air vent 128 may be provided through the cover plate for venting air from the cavity 124.

In one embodiment, the gauge base plate 92 has an overall thickness of approximately 30 mils with the precision lower hole portion 102 having a thickness of approximately 4 mils to 8 mils and the tapered upper hole portion 100 having an angle B of approximately 8° to 15°. The ball depth plate holes 120 have a diameter that is approximately 0.4 mils to 0.8 mils greater than the diameter of the gauge balls 96.

Having described several embodiments of the invention in detail, various modifications and improvements will readily occur to those skilled in the art. Such modifications and improvements are intended to be within the spirit and scope of the invention. Accordingly, the foregoing description is by way of example only and is not intended as limiting. The invention is limited only as defined by the following claims and their equivalents.

What is claimed is:

1. A verification gauge for verifying the operation of an inspection system for inspecting leads of an electronic package comprised of a package body and a plurality of conductive leads arranged on the package body in a lead pattern, the electronic package having a predefined limit for at least one mechanical parameter of the conductive leads, the verification gauge comprising:

a gauge body having a plurality of gauge holes disposed on an outer surface thereof, the gauge holes extending through a portion of the gauge body and being arranged to correspond to at least a portion of the lead pattern of the electronic package; and a plurality of gauge lead members disposed in the plurality of gauge holes, the plurality of gauge holes cooperating with the plurality of gauge lead members to maintain at least a portion of each gauge lead member protruding from a corresponding gauge hole by a predetermined amount beyond the outer surface of the gauge body, at least one of the gauge lead members having a predetermined mechanical relationship to the at least one mechanical parameter so that when the inspection system is used to inspect the verification gauge, the inspection system will provide a reading that is indicative as to whether the inspection system is properly set up for the at least one mechanical parameter.

2. The verification gauge recited in claim 1, wherein the gauge body is constructed and arranged to substantially conform to the shape of the package body.

3. The verification gauge recited in claim 2, wherein the gauge lead members are constructed and arranged to substantially conform to the shapes of the conductive leads.

4. The verification gauge recited in claim 3, wherein the electronic package is a ball grid array and the portion of each gauge lead member extending from the outer surface is spherically shaped.

5. The verification gauge recited in claim 1, wherein the plurality of gauge lead members is less than the plurality of conductive leads.

6. The verification gauge recited in claim 5, wherein the plurality of gauge holes is equal to the plurality of gauge lead members.

7. The verification gauge recited in claim 1, wherein the gauge body and the plurality of gauge lead members are constructed and arranged to maintain the predetermined mechanical relationship of the at least one gauge lead member to the at least one of the mechanical parameters when the gauge is subjected to repeated use and rough handling.

8. The verification gauge recited in claim 1, wherein the at least one mechanical parameter includes ball coplanarity, ball pitch, missing ball and ball deformation.

9. The verification gauge recited in claim 1, wherein the outer surface of the gauge body and the plurality of gauge lead members have a contrasting refraction index.

10. A method of manufacturing a verification gauge for verifying the operation of an inspection system for inspecting leads of a ball grid array comprised of a package body and a plurality of conductive balls arranged on the package body in a lead pattern, the ball grid array having a predefined limit for at least one mechanical parameter of the conductive balls, the method comprising steps of:

(a) providing a gauge base plate having a plurality of gauge holes extending therethrough that are arranged to correspond to at least a portion of the lead pattern of the ball grid array;

(b) providing a plurality of gauge balls; and (c) placing the plurality of gauge balls in the plurality of gauge holes with at least a portion of each gauge ball protruding from an outer surface of the gauge base plate, at least one of the gauge balls having a predetermined mechanical relationship to the at least one mechanical parameter so that when the inspection system is used to inspect the verification gauge, the inspection system will provide a reading that is indicative as to whether the inspection system is properly set up for the at least one mechanical parameter of the ball grid array.

11. A method for verifying the operation of an inspection system for inspecting leads of a ball grid array comprised of a package body and a plurality of conductive balls arranged in a lead pattern, the ball grid array having a predefined limit for a plurality of mechanical parameters of the conductive balls, the method comprising steps of:

(a) providing a plurality of verification gauges, each verification gauge comprised of a gauge body that is devoid of electronic circuitry, and a plurality of gauge balls arranged on the gauge body to correspond to at least a portion of the lead pattern, at least one of the gauge balls having a predetermined mechanical relationship to at least one of the plurality of mechanical parameters so that when the inspection system is used to inspect the verification gauge, the inspection system will provide a reading that is indicative as to whether the inspection system is properly set up for the at least one of the plurality of mechanical parameters of the ball grid array, wherein at least one of the predetermined mechanical relationship and the mechanical parameter is different for each of the verification gauges;

(b) inspecting at least one of the gauges with the inspection system for the at least one of the plurality of mechanical parameters; and (c) determining whether the inspection system is properly set up for detecting when the predefined limit for the at least one of the plurality of mechanical parameters is exceeded by the ball grid array.

12. The method recited in claim 11, wherein step (c) includes determining whether the inspection system is properly set up for inspecting at least one of ball coplanarity, ball pitch, missing ball and ball deformation.

13. The method recited in claim 12, wherein step (c) includes determining whether the inspection system is properly calibrated for the at least one mechanical parameter.

14. The method recited in claim 12, wherein step (c) includes determining whether the inspection system is properly programmed with the predefined limit for the at least one mechanical parameter.

15. The method recited in claim 12, wherein step (c) includes adjusting at least one of the calibration and the predefined limit of the inspection system for the at least one mechanical parameter based on the predetermined mechanical relationship.

16. The verification gauge recited in claim 1, wherein the plurality of gauge lead members includes a plurality of gauge balls disposed in the plurality of gauge holes.

17. The verification gauge recited in claim 16, wherein each of the plurality of gauge holes has a diameter, the diameter of at least one gauge hole being different than the diameter of the other gauge holes so that the gauge ball disposed in the at least one gauge hole protrudes from the gauge body by an amount that is different than the other gauge balls.

* * * * *